United States Patent [19]

Lefkow

[11] Patent Number: 4,600,489
[45] Date of Patent: Jul. 15, 1986

[54] METHOD AND APPARATUS FOR EVAPORATION ARC STABILIZATION FOR NON-PERMEABLE TARGETS UTILIZING PERMEABLE STOP RING

[75] Inventor: Anthony R. T. Lefkow, Worthington, Ohio

[73] Assignee: VAC-TEC Systems, Inc., Boulder, Colo.

[21] Appl. No.: 572,007

[22] Filed: Jan. 19, 1984

[51] Int. Cl.⁴ ............................................. C23C 15/00
[52] U.S. Cl. .............................. 204/192 R; 118/715; 118/722; 118/723; 204/192 E; 204/298; 219/123; 313/157; 315/187; 315/118; 427/42
[58] Field of Search ................ 204/298, 192 R, 192 E

[56] References Cited

U.S. PATENT DOCUMENTS

| | | | |
|---|---|---|---|
| 2,972,695 | 2/1961 | Wroe | 313/157 |
| 3,625,848 | 12/1971 | Snaper | 204/192 R |
| 3,730,873 | 5/1973 | Pompei et al. | 204/192 E |
| 3,783,231 | 1/1974 | Sablev et al. | 219/123 |
| 3,793,179 | 2/1974 | Sablev et al. | 204/298 |
| 3,836,451 | 9/1974 | Snaper | 204/298 |
| 4,405,435 | 9/1983 | Tateishi et al. | 204/298 |
| 4,430,184 | 2/1984 | Mularie et al. | 204/192 R |
| 4,448,659 | 5/1984 | Morrison | 204/192 R |

OTHER PUBLICATIONS

"Vacuum-Arc Evaporation of Ferrites and Compositions of Their Deposit", Japanese Journal of Applied Physics, vol. 10, No. 6, Jun. 1971, Masahiko Naoe and Shunichi Yamanaka.
Soviet Inventions Illustrated, vol. 37, Oct. 24, 1979, Derwent Publications, B. G. Goldiner.

Primary Examiner—Arthur P. Demers
Attorney, Agent, or Firm—Gerald J. Ferguson, Jr.; James E. Bryan; Michael P. Hoffman

[57] ABSTRACT

Apparatus and method for evaporation arc stabilization including a target having a surface of material of non-permeable material to be evaporated; circuitry for establishing an arc on the target surface for evaporating the target material, the arc being characterized by the presence of charged particles and a cathode spot which randomly migrates over the target surface; and a confinement ring surrounding the target surface, the ring being composed of a magnetically permeable material to thereby confine the cathode spot to the target surface.

19 Claims, 7 Drawing Figures

METHOD AND APPARATUS FOR EVAPORATION ARC STABILIZATION FOR NON-PERMEABLE TARGETS UTILIZING PERMEABLE STOP RING

RELATED PATENT APPLICATIONS

This application is related to application Ser. No. 492,831, filed May 9, 1983 by William M. Mularie entitled "Improved Apparatus and Method For Evaporation Arc Stabilization", now U.S. Pat. No. 4,430,184. It is also related to an application entitled "Improved Apparatus and Method For Evaporation Arc Stabilization For Permeable Targets" by William M. Mularie, filed on even date herewith. Furthermore, it is also related to an application entitled "Improved Method and Apparatus For Evaporation Arc Stabilization Including Initial Target Cleaning", filed by Charles F. Morrison, Jr. on even date herewith. All of the above applications are assigned to the assignee of the present application.

BACKGROUND OF THE INVENTION

This invention relates to arc stabilization processes and devices which may be employed, for example, in arc coating systems. Such coating systems are disclosed in U.S. Pat. Nos. 3,625,848 and 3,836,451 to Alvin A. Snaper and U.S. Pat. Nos. 3,783,231 and 3,793,179 to L. Sablev, et al, all of which are incorporated herein by reference and copies are submitted herewith. These systems are characterized by high deposition rates and other advantageous features. However, these advantages can be somewhat offset due to instability of the arc. That is, the arc involves currents of about 60 amperes, or more, concentrated into a cathode spot so small that current densities are $10^3$ to $10^6$ amperes per square inch. The voltages are 15 to 45 volts. Thus, power densities at the tiny cathode spot are in the order of megawatts/inch$^2$. Accordingly, local violence is an understatement. The target surface under the cathode spot flash evaporates from the intense heat. It is this evaporated target material which deposits as the coating on a substrate. The cathode spot migrates about the target surface in a random, jerky motion with reported velocities of many meters per second. Because of this random movement, damage to the device and contamination of the coating can occur if the spot moves off the target surface.

Different solutions to the arc instability problem have been proposed. Thus, in Sablev, et al, Pat. No. 3,793,179, a shield is placed close to the edge of the target. In particular, it is placed at a distance from the target which represents less than a mean free path of the gas present. In an arc discharge, gas and plasma are generated at the cathode spot with sufficient violence that local mean-free-paths may occasionally be reduced to a few thousandths of an inch. When such a blast of local high pressure is blown under the shield, which is spaced at several millimeters (~80 thousandths of an inch), there is finite possibility the arc can migrate under the shield. When this happens, there will be arc damage to the cathode, contamination of the evaporant, or the arc will extinguish.

Sablev, et al. U.S. Pat. No. 3,783,231 (copy submitted herewith) apparently addresses the foregoing problem by providing a feedback mechanism of some complexity that emphasizes the frustrations caused by the problem. The feedback involves the utilization of a magnetic field to retain the cathode spot on the target surface. U.S. Pat. No. 2,972,695 (copy submitted herewith) to H. Wroe also suggests the utilization of a magnetic field for cathode spot retention.

SUMMARY OF THE INVENTION

It is an object of the present invention to provide, in an arc evaporation process, stabilization of the arc for non-permeable targets in such a manner as to avoid the inadequacies and complexities of the prior art approaches.

Furthermore, it is an object of this invention to provide an arc confinement ring of the above type for non-permeable targets which is rugged yet inexpensive.

It is a further object of this invention to provide arc stabilization of the above type for use in arc coating processes.

Generally, this is effected by surrounding a predetermined area of the evaporation surface of a non-permeable target with a confinement ring made of a permeable material which directs the arc back to the evaporation surface whenever it approaches the confinement ring. Hereinafter, this type ring will be termed a "P-ring".

Other objects and advantages of this invention will be apparent from a reading of the following specification and claims taken with the drawing.

DETAILED DESCRIPTION OF PREFERRED EMBODIMENTS

Figure 1:
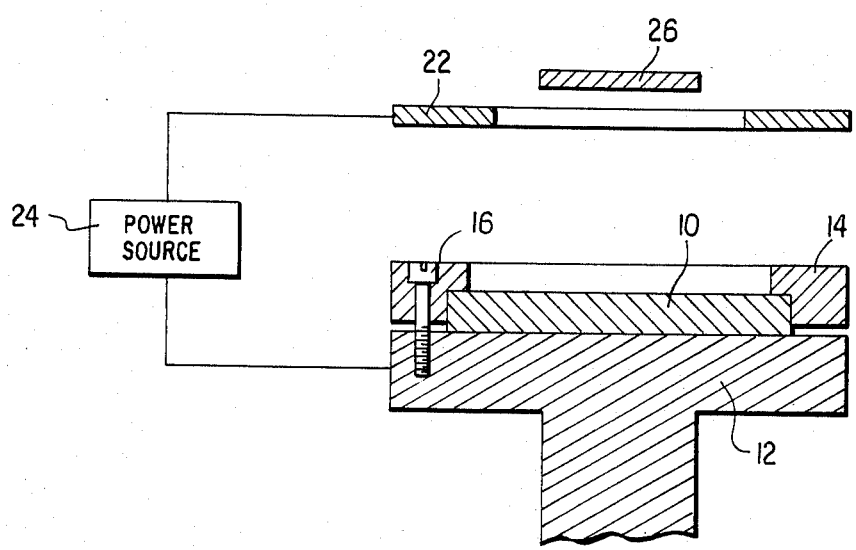
FIG. 1 is a schematic diagram in cross-section of an illustrative embodiment of an arc stabilization apparatus in accordance with the invention where a non-permeable target is confined by a permeable stop ring.

Reference should be made to the drawing where like reference numerals refer to like parts.

Referring to FIG. 1, there is shown a non-permeable target 10 retained to a water cooled cathode body 12 by an arc confinement ring 14. The ring is made of a magnetically permeable material such as soft iron or Permalloy. In fact, any material considered to be permeable may be used such materials including but not being limited to iron; nickel; cobalt; and alloys thereof with small amounts of optional additives; ferrites; steel; etc. As will be discussed further below, it is the permeable character of the ring which retains the arc on the non-permeable target thereby effecting the desired arc stabilization in a rugged yet inexpensive manner. Furthermore, the ring may retain the target with respect to the cathode body as indicated by bolt 16. As stated above, a permeable ring to effect arc stabilization will hereafter be termed a "P-ring".

Also diagrammatically shown in FIG. 1 are conventional elements employed in arc evaporation coating including an anode 22, a power source 24 and a substrate 26. Means (not shown) is typically employed to strike an arc between the anode and target, which is typically at cathode potential. The arc is characterized by the presence of charged particles and a cathode spot which randomly migrates over the target surface. Once the arc is established, the target material is evaporated in a unique manner due to the high energy of the arc where the mean charged particle energies thereof can extend from 20–100 eV and typically from 40–60 eV. The evaporated material is coated on the substrate where, in certain instances, the substrate may also function as the anode. Furthermore, the non-permeable target may comprise an electrically conductive material such as a metal or a electrically insulative material. Typically, the power source 26 is DC for electrically conductive targets and RF for electrically insulative targets. Additionally, the target and cathode, in some instances, any comprise the same member.

Arc stabilization is effected in the above mentioned pending application Ser. No. 492,831 by surrounding target with a confinement ring made of a material such as boron nitride or titanium nitride. Hereinafter, this type ring will be termed an "N-ring".

Although there is no intent to be limited to a particular theory of operation, the following considerations apparently are applicable to P-rings of the present invention. It has been observed a vacuum arc struck on a non-permeable target wanders randomly about, most often leaving the target for other areas of the cathode within a second or so. A permeable target looses the arc to other cathode areas in milliseconds. Obviously, for uncontaminated coatings, the arc must remain only on the target.

Figure 2A:
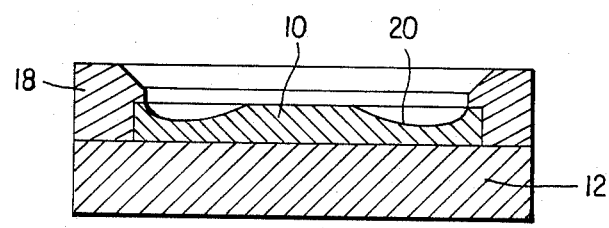
FIG. 2(a) is a schematic diagram in cross-section illustrating the erosion pattern which results when a permeable target is confined by an N-ring.
Figure 2B:
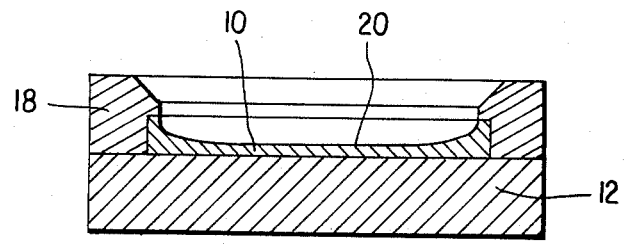
FIG. 2(b) is a schematic diagram in cross-section which illustrates the uniform erosion pattern which results when a non-permeable target is confined by a N-ring in accordance with above-mentioned, pending application Ser. No. 492,831.

With respect to the fast loss of arc from unguarded permeable targets, an attempt was made by the assignee of the present application to arc evaporate a circular target of Permalloy bounded by an N-ring. This resulted in erosion only close to the N-ring as can be seen in FIG. 2(a) where the target is indicated at 10, the N-ring at 18, the cathode body at 12, and the erosion pattern at 20. FIG. 2(b) shows a normal erosion pattern 18 for non-permeable targets obtained with an N-ring, as disclosed in co-pending application Ser. No. 492,831. Examination of the target of FIG. 2(a) indicates the arc is influenced to move toward the edge of the permeable target, for there is no reason to expect it to move specifically toward the N-ring otherwise. The early literature of magnetic fields applied to the vacuum arc indicates the arc moves most readily in the direction of greatest magnetic field density. Assuming this is the mechanism for forcing the arc to the edge of the target in FIG. 2(a), it appears the arc moves away from the permeable material that reduces field density.

Another insight relating to the containment mechanism is obtained from the work of Naoe and Yamanaka ("Vacuum-Arc Evaporations of Ferrites and Compositions of Their Deposits", Japanese Journal of Applied Physics, Vol. 10, No. 6, June 1971, who arc-evaporated ferrite composites from a cup-shaped ferrite target. They were attaining a melted portion of the target, and the oxide materials behaved very differently from the metals. They reported a very stable arc that moved in a very slow circular motion at the approximate center of the cup. They made no reference to this as unusual behavior, but gave considerable detail of the arc motion as observed visually. Implications relative to general arc containment were lacking.

To better understand this phenomenon, the assignee of the present invention has used a DC current through a wire to generate a cylindrical magnetic field of the type that the arc appears to produce close to the target. This wire has been brought into the proximity of various geometrics of permeable targets and "iron filings diagrams" produced to give insights to the maghetic influence of these permeable materials on the magnetic field.

It should be noted this is somewhat different from the application of a magnetic field to interact with the arc field as applied in aforementioned U.S. Pat. Nos. 2,972,695 and 3,783,231, for no external field is applied. When current is passed through the wire, magnetic flux is generated symmetrically around the wire. When two wires are placed in parallel with current in the same direction through them, the wires are pulled toward each other. The field generated between the wires is cancelled, for the flux direction is different on the right versus the left of the wire.

Figure 3A:
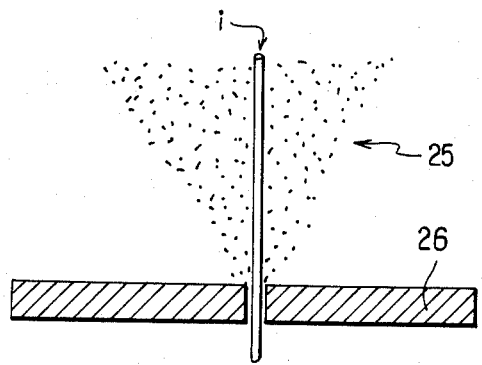
FIGS. 3(a), 3(b), 4(a), and 4(b) are schematic "iron filings" diagrams in cross-section which illustrate various conditions of permeable and non-permeable targets.
Figure 3B:
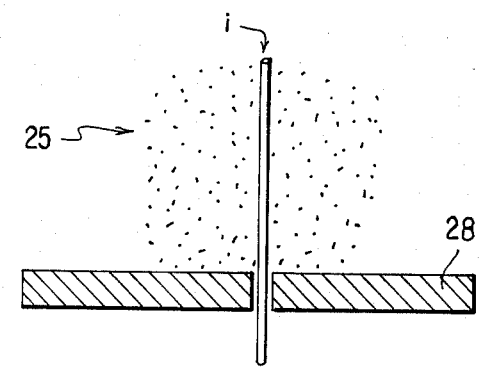
Figure 4A:
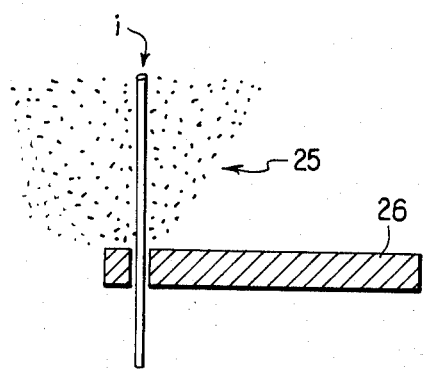
Figure 4B:
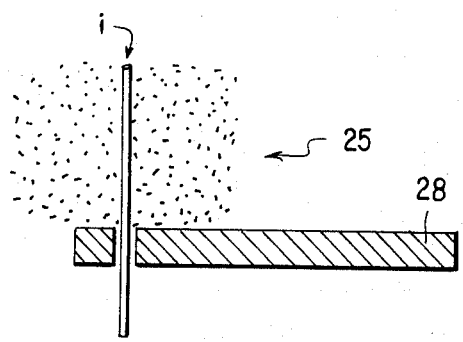

In actuality, an arc is quite unique, and modeling it as a wire with current flowing is not a true indicator of what an arc will do. If sufficient current is permitted to flow in the arc, it will divide itself into two simultaneous arc spots moving independently about the cathode surface. This is quite the reverse of the wires which move together as current flows. Simple explanation of this difference between the arc and the wire is sometimes given in terms of the electrons being free to move sideways in space in the arc, but being confined within the wire. They try to move sideways in the wire, creating equal and opposite forces on the wires. Thus, the wire moves opposite to the direction the arc moves where the magnitude of the force moving an arc toward the edge of a permeable target is significant relative to the random motion forces that typically move the arc about a non-permeable target. FIGS. 3(a), 3(b), 4(a), and 4(b) show the nature of the filing diagrams from the various conditions of permeable and non-permeable targets. In FIG. 3(a) less and less flux density 25 is seen as the iron plate 26 is approached, for these lines (of which only the cross-sections are seen) are drawn into the iron, for they travel more easily there. In the case of the aluminum target 28, the flux remains very constant as the plate is approached, as can be seen in FIG. 3(b). Moving to the target edge, as in FIG. 4(b), makes no change in the case of the aluminum target. However, as shown in FIG. 4(a), movement to the edge of the iron target produces a reasonably strong flux outboard of the target, and virtually none inboard. With the force on the arc thus outward, it is quite understandable that the arc races for the outside edge. The forces will be nil when the arc is perfectly in the target center, but normal random migration from the arc action will quickly push it off center. As it gets closer to an edge, the force toward the edge multiplies. It is thus quite logical that erosion would occur as shown in FIG. 2(a), for the arc is trapped between the induced electromagnetic force outward, and the N-ring which prevents the arc from moving further outward. There is relative freedom of motion only into the plane of FIG. 2(a). Thus the arc moves around the target perpendicularly to the trap. The attempt here is not to fully define the arc motion, but only to show certain aspects of it can be significantly influenced for purposes of control.

Furthermore, it follows that in the embodiment of FIG. 1, there is less flux density as the permeable ring is approached by an arc for the lines of force more easily travel in the ring. In particular, the magnetic field generated by the current of the vacuum arc interacts with the permeable stop ring to provide full containment of the arc upon the target. Accordingly, the force on the arc is away from the ring toward the area of greater flux density of the target.

It is noted the permeable material of stop ring has a higher arc voltage than that of the target material. It is reported in the literature that once an arc wanders off of a higher arc voltage material to a lower, it will not return. This is given only passing comment, but is does present an additional possible way to provide arc containment. Furthermore, there is the question as to what happens when a sufficient layer of the lower voltage target material coats on the other. In any event, iron is listed as the highest arc voltage metal, so the arc-stop of the present invention is advantageous in both respects—that is, high arc voltage and permeability. It is thought, however, the permeability is the primary factor in that the arc tends to stay almost too far away from the confinement ring with some modification of the erosion pattern. This is quite different from the target retained by an N-ring which erodes very uniformly to very close to the ring.

Yet the P-ring of the present invention can provide uniform erosion and is also very advantageous due to its rugged, yet inexpensive construction.

It is to be understood that the above detailed description of the various embodiments of the invention is provided by way of example only. Various details of design and construction may be modified without departing from the true spirit and scope of the invention as set forth in the appended claims.

I claim:

1. Apparatus for evaporation arc stabilization comprising
   a target having a surface of non-permeable material to be evaporated;
   means for establishing an arc on the target surface for evaporating the target material, the arc being characterized by the presence of charged particles and a cathode spot which randomly migrates over said target surface; and
   a confinement ring surrounding contacting the target surface, the ring being composed of a magnetically permeable material to thereby confine the cathode spot to the target surface.

2. Apparatus as in claim 1 where the mean charged particle energies of said arc are 20-100 eV.

3. Apparatus as in claim 2 where the mean charged particle energies of said arc are 40-60 eV.

4. Apparatus as in claim 1 where the permeable material is selected from the group consisting of soft iron and Permalloy.

5. Apparatus as in claim 1 including a substrate upon which the evaporated target material is deposited as a coating.

6. Apparatus as in claim 5 where the anode and substrate are the same member.

7. Apparatus as in claim 1 where said target is composed of an electrically conductive material.

8. Apparatus as in claim 1 where said target is composed of an electrically insulative material.

9. Apparatus as in claim 1 where the means for establishing the arc on the target surface includes a cathode and an anode.

10. Apparatus as in claim 9 where said target is mounted on said cathode.

11. Apparatus as in claim 9 where said target and cathode are the same member.

12. A method of evaporation arc stabilization comprising the steps of
    establishing an arc on a surface of a target of non-permeable material to evaporate the target, the arc being characterized by the presence of charged particles and a cathode spot which randomly migrates over said target surface; and
    confining the arc to the target surface with a confinement ring which surrounds and contacts the target surface, the ring being composed of a magnetically permeable material.

13. A method as in claim 12 where the mean charged particle energies of said arc are 20-100 eV.

14. A method as in claim 13 where the mean charged particle energies of said arc are 40-60 eV.

15. A method as in claim 12 where the permeable material compound is selected from the group consisting of iron and Permalloy.

16. A method as in claim 12 where said target is composed of an electrically conductive material.

17. A method as in claim 16 where said electrically conductive material is metallic.

18. A method as in claim 12 where said target is composed of an electrically insulative material.

19. A method as in claim 12 including depositing the evaporated target material on a substrate as a coating.

* * * * *